US010320180B1

(12) United States Patent
Venigalla et al.

(10) Patent No.: US 10,320,180 B1
(45) Date of Patent: Jun. 11, 2019

(54) CURRENT CONTROL AND PROTECTION FOR UNIVERSAL SERIAL BUS TYPE-C (USB-C) CONNECTOR SYSTEMS

(71) Applicant: Cypress Semiconductor Corporation, San Jose, CA (US)

(72) Inventors: Ramakrishna Venigalla, Bangalore (IN); Arun Khamesra, Bangalore (IN); Hemant P. Vispute, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/145,779

(22) Filed: Sep. 28, 2018

Related U.S. Application Data

(60) Provisional application No. 62/721,398, filed on Aug. 22, 2018, provisional application No. 62/668,682, (Continued)

(51) Int. Cl.
*H02H 3/00* (2006.01)
*H02H 3/18* (2006.01)
(Continued)

(52) U.S. Cl.
CPC ............. *H02H 3/18* (2013.01); *G06F 1/266* (2013.01); *G06F 13/385* (2013.01); *H01R 13/6666* (2013.01); *H01R 13/6683* (2013.01); *H01R 13/703* (2013.01); *H02H 3/087* (2013.01); *H02J 7/0052* (2013.01); *H03K 17/08122* (2013.01); *G06F 2213/0042* (2013.01); *H02J 2007/0062* (2013.01)

(58) Field of Classification Search
USPC ...................... 361/84, 86, 87, 90, 93.2, 93.9
See application file for complete search history.

(56) References Cited

U.S. PATENT DOCUMENTS 6,882,513 B2 4/2005 Laraia
7,689,841 B2 3/2010 Lee
(Continued)

FOREIGN PATENT DOCUMENTS

CN 202524058 U 11/2012
CN 207134574 U 3/2018

OTHER PUBLICATIONS

"PTN5100 USB Type-C power delivery PHY and protocol IC," NXP Semiconductors, Jul. 25, 2017, 53 pages.

*Primary Examiner* — Ronald W Leja

(57) ABSTRACT

An electronic device includes a power switch configured to receive a voltage on a first terminal. The first terminal is coupled to a voltage regulator. The power switch is also configured to provide the voltage to a second terminal. The second terminal is coupled to a VBUS terminal of a Universal Serial Bus Type-C (USB-C) connector. The electronic device also includes a protection circuit comprising a comparison component coupled to the first terminal and the second terminal. The comparison component is configured to detect a first voltage at the first terminal detect a second voltage at the second terminal. The protection circuit is configured to determine whether the second voltage is within a threshold voltage of the first voltage and adjust operation of the power switch in response to determining that the second voltage is within the threshold voltage of the first voltage.

20 Claims, 11 Drawing Sheets

Related U.S. Application Data filed on May 8, 2018, provisional application No. 62/662,096, filed on Apr. 24, 2018.

(51) Int. Cl.
*H02J 7/00* (2006.01)
*H02H 3/087* (2006.01)
*H01R 13/703* (2006.01)
*G06F 13/38* (2006.01)
*H01R 13/66* (2006.01)
*H03K 17/0812* (2006.01)
*G06F 1/26* (2006.01)

(56) References Cited

U.S. PATENT DOCUMENTS

| | | | |
|---|---|---|---|
| 7,960,861 B2 * | 6/2011 | Gscheidle | H02J 1/108 |
| | | | 307/43 |
| 8,120,884 B2 | 2/2012 | Zhang | |
| 8,193,779 B2 | 6/2012 | Ferguson | |
| 9,088,158 B2 | 7/2015 | Maggio et al. | |
| 9,294,080 B2 | 3/2016 | Daigle et al. | |
| 9,601,916 B2 | 3/2017 | Srivastava et al. | |
| 2005/0001594 A1 | 1/2005 | Felder | |
| 2013/0063116 A1 | 3/2013 | Sun et al. | |
| 2016/0094226 A1 * | 3/2016 | Wang | H03K 5/125 |
| | | | 307/130 |
| 2016/0179155 A1 * | 6/2016 | Lester | G06F 1/263 |
| | | | 713/300 |
| 2017/0005500 A1 * | 1/2017 | Zhang | H02J 7/0021 |
| 2017/0047731 A1 | 2/2017 | Manohar et al. | |
| 2017/0242707 A1 * | 8/2017 | Hays | G06F 13/385 |
| 2017/0317583 A1 | 11/2017 | Forghani-zadeh et al. | |
| 2017/0331270 A1 * | 11/2017 | Mattos | H02H 3/087 |
| 2017/0353113 A1 * | 12/2017 | Ono | H02J 7/0072 |
| 2018/0131283 A1 * | 5/2018 | Ono | H02J 1/00 |
| 2018/0341309 A1 * | 11/2018 | Sporck | G06F 1/266 |
| 2018/0341310 A1 * | 11/2018 | Lambert | G06F 1/266 |
| 2018/0373308 A1 * | 12/2018 | Sultenfuss | G06F 1/3212 |
| 2019/0012277 A1 * | 1/2019 | Wendt | H05B 37/0272 |
| 2019/0033953 A1 * | 1/2019 | Kadgi | G06F 1/3287 |

\* cited by examiner

CURRENT CONTROL AND PROTECTION FOR UNIVERSAL SERIAL BUS TYPE-C (USB-C) CONNECTOR SYSTEMS

CROSS-REFERENCE TO RELATED APPLICATIONS

This application claims the benefit of U.S. Provisional Application No. 62/662,096 filed on Apr. 24, 2018, U.S. Provisional Application No. 62/668,682 filed on May 8, 2018, and U.S. Provisional Application No. 62/721,398 filed on Aug. 22, 2018. The entire contents of the above-referenced applications are hereby incorporated by reference in their entireties.

TECHNICAL FIELD

Aspects of the present disclosure generally relate to Universal Serial Bus (USB) Type-C connector subsystems, and more particularly, to reverse current protection and current control for USB Type-C connector subsystems.

BACKGROUND

Various electronic devices (e.g., such as smartphones, tablets, notebook computers, laptop computers, hubs, chargers, adapters, etc.) are configured to transfer power through a USB-C connector system. For example, in some applications an electronic device may be configured as a power consumer to receive power through a USB-C connector system (e.g., for battery charging), while in other applications an electronic device may be configured as a power provider to provide power to another device that is connected thereto through a USB-C connector system. Electronic devices are typically configured to transfer power through Field Effect Transistors (FETs), or other similar switching devices. In some instances, the FETs may become susceptible to electrical damage (e.g., overcurrent damage, overvoltage damage, overheating damage, reverse current damage, and so forth) due to, for example, one or more electrical faults possibly occurring on the USB-C connector system.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
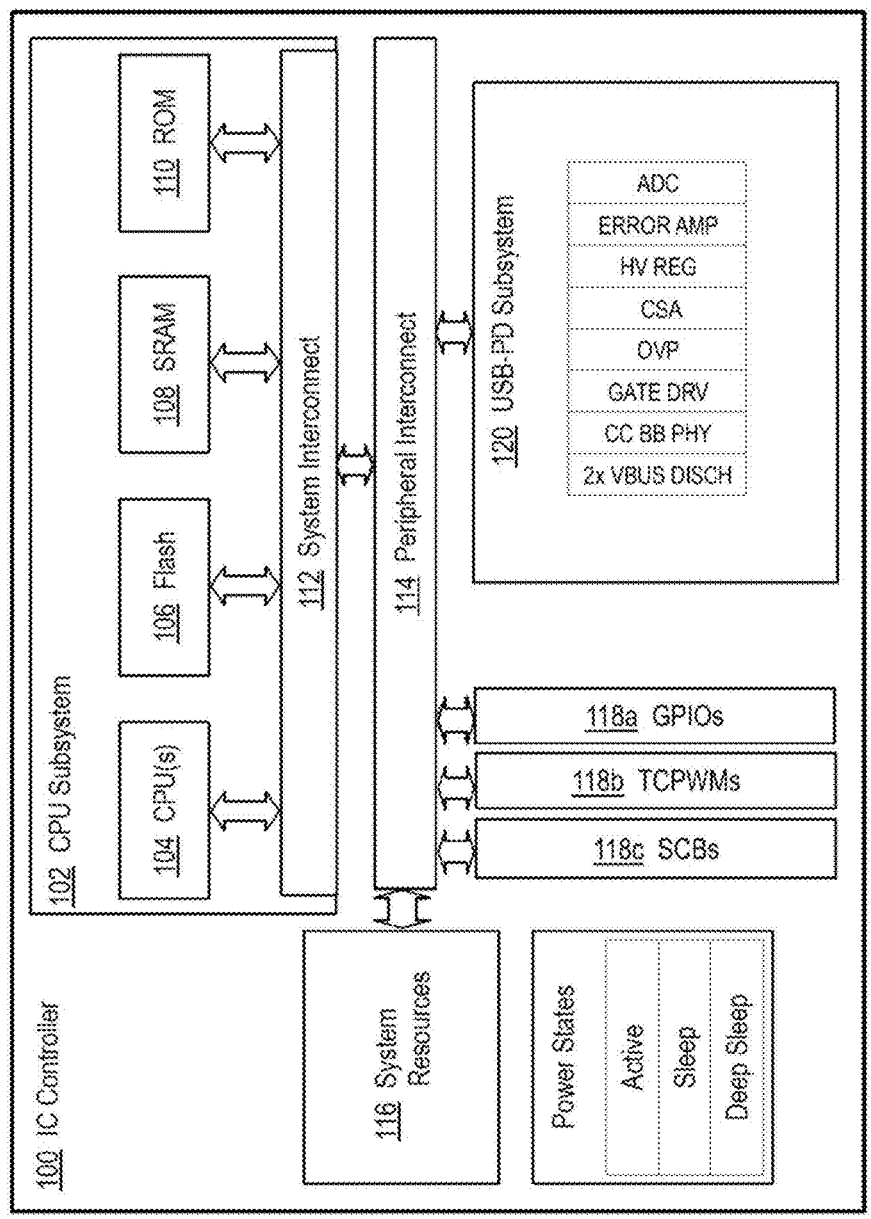
FIG. 1 is a block diagram that illustrates integrated circuit (IC) controller system, in accordance with some embodiments of the present disclosure.

Described herein are various embodiments of techniques for reverse current protection and current control for USB-C connector systems in electronic devices. Examples of such electronic devices include, without limitation, personal computers (e.g., laptop computers, notebook computers, and so forth), mobile computing devices (e.g., tablets, tablet computers, e-reader devices, and so forth), mobile communication devices (e.g., smartphones, cell phones, personal digital assistants, messaging devices, pocket PCs, and so forth), connectivity and charging devices (e.g., hubs, docking stations, adapters, chargers, etc.), audio/video/data recording and/or playback devices (e.g., cameras, voice recorders, hand-held scanners, monitors, and so forth), and other similar electronic devices that can use USB connectors (interfaces) for communication and/or battery charging.

A USB-enabled electronic device or a system may comply with at least one release of a Universal Serial Bus (USB) specification. Examples of such USB specifications include, without limitation, the USB Specification Revision 2.0, the USB 3.0 Specification, the USB 3.1 Specification, and/or various supplements (e.g., such as On-The-Go, or OTG), versions and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (denoted DPWR), and a ground line for power return (denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

A more recent technology for USB connectors, called USB Type-C, is defined in various releases and/or versions of the USB Type-C specification (e.g., such as Release 1.0 dated Aug. 11, 2014, Release 1.1 dated Apr. 3, 2015, etc.). The USB Type-C specification defines Type-C receptacle, Type-C plug, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, etc. According to the USB Type-C specification(s), a Type-C port provides VBUS, D+, D−, GND, SSTX+, SSTX−, SSRX+, and SSRX− lines, among others. In addition, a Type-C port also provides a Sideband Use (denoted SBU) line for signaling of sideband functionality and a Configuration Channel (denoted CC) line for discovery, configuration, and management of connections across a Type-C cable. A Type-C port may be associated with a Type-C plug and/or a Type-C receptacle. For ease of use, the Type-C plug and the Type-C receptacle are designed as a reversible pair that operates regardless of the plug-to-receptacle orientation. Thus, a standard USB Type-C connector, disposed as a standard Type-C plug or receptacle, provides pins for four VBUS lines, four ground return (GND) lines, two D+ lines (DP1 and DP2), two D− lines (DN1 and DN2), two SSTX+ lines (SSTXP1 and SSTXP2), two SSTX− lines (SSTXN1 and SSTXN2), two SSRX+ lines (SSRXP1 and SSRXP2), two SSRX− lines (SSRXN1 and SSRXN2), two CC lines (CC1 and CC2), and two SBU lines (SBU1 and SBU2), among others.

Some USB-enabled electronic devices may be compliant with a specific revision and/or version of the USB-PD specification (e.g., such as Revision 1.0, Revision 2.0, etc., or later revisions/versions thereof). The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., such as USB-enabled devices) may negotiate for more current and/or higher or lower voltages over a USB Type-C cable than are allowed in older USB specifications (e.g., such as the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that can be accommodated by both devices, and can be dynamically re-negotiated (e.g., without device un-plugging) upon request by either device and/or in response to various events and conditions, such as power role swap, data role swap, hard reset, failure of the power source, etc.

An electronic device typically uses a power-transfer circuit (power path) to transfer power to/from the device. Among other electronic components, a power path may include one or more power-FETs that are coupled in-line on the circuit path to operate as switches (e.g., as "ON"/"OFF" switches). Power-FETs differ in some important characteristics from FETs and other types of transistor switch devices that are used for other, non-power-transfer applications. As a discrete semiconductor switching device, a power-FET may carry a large amount of current between its source and its drain while it is "ON", may have low resistance from its source to its drain while it is "ON", and may withstand high voltages from its source to its drain while it is "OFF". For example, a power-FET may be characterized as being able to carry currents in the range of several hundred milliamps (e.g., 500-900 mA) to several amps (e.g., 3-5 A, or higher), and to withstand voltages in the range of 12V to 40V (or higher) across its source to its drain. For example, the resistance between the source and the drain of a power-FET device may be very small in order to prevent, for example, the power loss across the device. The examples, implementations, and embodiments disclosed herein may use different types of switches, transistors, and FETs such as metal-oxide FETs (MOSFETs), nFETs (e.g., N-type MOSFETs), pFETS (e.g., P-type MOSFETS), drain extended FETs, drain extended switches, etc.

FIG. 1 illustrates an example semiconductor device that is configured in accordance with the techniques for current protection and current control described herein. In the embodiment illustrated in FIG. 1, device 100 is an integrated circuit (IC) controller manufactured on a single semiconductor die. For example, IC controller 100 may be a single-chip IC device from the family of CCGx USB controllers developed by Cypress Semiconductor Corporation, San Jose, Calif. In another example, IC controller 100 may be a single-chip IC that is manufactured as a System-on-Chip (SoC). In other embodiments, the IC controller may be a multi-chip module encapsulated in a single semiconductor package. Among other components, IC controller 100 includes CPU subsystem 102, peripheral interconnect 114, system resources 116, various input/output (I/O) blocks 118 (e.g., 118A-118C), and USB-PD subsystem 120.

CPU subsystem 102 includes one or more CPUs (central processing units) 104, flash memory 106, SRAM (Static Random Access Memory) 108, and ROM (Read Only Memory) 110 that are coupled to system interconnect 112. CPU 104 is a suitable processor that can operate in an IC or a SoC device. In some embodiments, the CPU may be optimized for low-power operation with extensive clock gating and may include various internal controller circuits that allow the CPU to operate in various power states. For example, the CPU may include a wake-up interrupt controller that is configured to wake the CPU from a sleep state, thereby allowing power to be switched off when the IC chip is in the sleep state. Flash memory 106 is non-volatile memory (e.g., NAND flash, NOR flash, etc.) that is configured for storing data, programs, and/or other firmware instructions. Flash memory 106 is tightly coupled within the CPU subsystem 102 for improved access times. SRAM 108 is volatile memory that is configured for storing data and firmware instructions accessed by CPU 104. ROM 110 is read-only memory (or other suitable storage medium) that is configured for storing boot-up routines, configuration parameters, and other firmware parameters and settings. System interconnect 112 is a system bus (e.g., a single-level or multi-level Advanced High-Performance Bus, or AHB) that is configured as an interface that couples the various components of CPU subsystem 102 to each other, as well as a data and control interface between the various components of the CPU subsystem and peripheral interconnect 114.

Peripheral interconnect 114 is a peripheral bus (e.g., a single-level or multi-level AHB) that provides the primary data and control interface between CPU subsystem 102 and its peripherals and other resources, such as system resources 116, I/O blocks 118, and USB-PD subsystem 120. The peripheral interconnect 114 may include various controller circuits (e.g., direct memory access, or DMA controllers), which may be programmed to transfer data between peripheral blocks without burdening the CPU subsystem 102. In various embodiments, each of the components of the CPU subsystem and the peripheral interconnect may be different with each choice or type of CPU, system bus, and/or peripheral bus.

System resources 116 include various electronic circuits that support the operation of IC controller 100 in its various states and modes. For example, system resources 116 may include a power subsystem that provides the power resources required for each controller state/mode such as, for example, voltage and/or current references, wake-up interrupt controller (WIC), power-on-reset (POR), etc. In some embodiments, the power subsystem may also include circuits that allow IC controller 100 to draw and/or provide power from/to external sources with several different voltage and/or current levels and to support controller operation in several power states (e.g., deep sleep, sleep and active states). System resources 116 may also include a clock subsystem that provides various clocks that are used by IC controller 100, as well as circuits that implement various controller functions such as external reset.

An IC controller, such as IC controller 100, may include various different types of I/O blocks and subsystems in various embodiments and implementations. For example, in the embodiment illustrated in FIG. 1, IC controller 100 includes GPIO (general purpose input output) blocks 118a, TCPWM (timer/counter/pulse-width-modulation) blocks 118b, SCBs (serial communication blocks) 118c, and USB-PD subsystem 120. GPIOs 118a include circuits configured to implement various functions such as, for example, pull-ups, pull-downs, input threshold select, input and output buffer enabling/disabling, multiplex signals connected to various I/O pins, etc. TCPWMs 118b include circuits configured to implement timers, counters, pulse-width modulators, decoders and various other analog/mixed signal elements that are configured to operate on input/output signals. SCBs 118c include circuits configured to implement various serial communication interfaces such as, for example, I2C, SPI (serial peripheral interface), UART (universal asynchronous receiver/transmitter), CAN (Controller Area Network) interface, CXPI (Clock eXtension Peripheral Interface), etc.

USB-PD subsystem 120 provides the interface to a USB Type-C port and is configured to support USB communications as well other USB functionality, such as power delivery and battery charging. USB-PD subsystem 120 includes the electro-static discharge (ESD) protection circuits required on a Type-C port. USB-PD subsystem 120 also includes a Type-C transceiver and physical layer logic (PHY), which are configured as an integrated baseband PHY circuit to perform various digital encoding/decoding functions (e.g., Biphase Mark Code-BMC encoding/decoding, cyclical redundancy checks-CRC, etc.) and analog signal processing functions involved in physical layer transmissions. USB-PD subsystem 120 also provides the termination resistors (RP and RD) and their switches, as required by the USB-PD specification, to implement connection detection, plug orientation detection, and power delivery roles over a Type-C cable. IC controller 100 (and/or the USB-PD subsystem 120 thereof) may also be configured to respond to communications defined in a USB-PD Specification such as, for example, SOP, SOP', and SOP" messaging.

Among other circuitry, USB-PD subsystem 120 may further include: an analog-to-digital convertor (ADC) for converting various analog signals to digital signals; an error amplifier (ERROR AMP) for controlling the power source voltage applied to the VBUS line per a PD contract; a high voltage regulator (HV REG) for converting the power source voltage to the precise voltage (e.g., 3-5V) needed to power IC controller 100; a current sense amplifier (CSA) and an over-voltage protection (OVP) circuit for providing over-current and over-voltage protection on the VBUS line with configurable thresholds and response times; one or more gate drivers (GATE DRV) for controlling the power switches that turn on and off the provision of power over the VBUS line; and a communication channel PHY (CC BB PHY) logic for supporting communications on a Type-C Communication Channel (CC) line.

In USB-PD applications, the VBUS terminals may be susceptible to a reverse current condition during a system level fault. In this fault condition, amps of current may flow backwards to a power source, such as a voltage regulator. The reverse current may thus cause electrical and/or thermal damage (e.g., overcurrent damage, overheating damage, and so forth) to the power source. In some embodiments, a power circuit may include a reverse current protection during system level fault. Thus, the present techniques may detect reverse current flow and then turn off a switch to avoid any potential electrical and/or thermal damage due to reverse current.

Reverse Current Protection and Current Control

Figure 2:
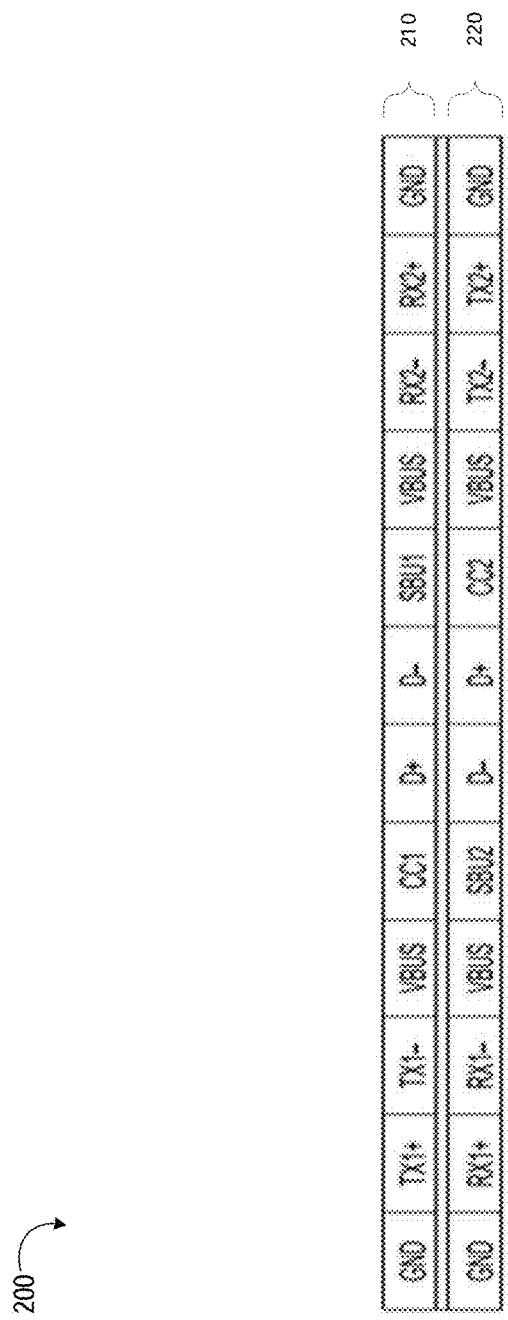
FIG. 2 is a diagram that illustrates an example pin layout for pins that may be included in a USB-C connector or USB-C receptacle, in accordance with some embodiments of the present disclosure.

FIG. 2 is a diagram that illustrates an example pin layout 200 for pins (e.g., terminals, lines, wires, traces, etc.) that may be included in a USB-C plug or USB-C receptacle, in accordance with some embodiments of the present disclosure. The pin layout 200 includes two sets of pins, set 210 and set 220. Starting from left to right, set 210 includes a GND pin, a TX1+ and TX1− pin, a VBUS pin, a CC1 pin, a D+ pin, a D− pin, a SBU1 pin, a VBUS pin, a RX2− pin, a RX2+ pin, and a GND pin. The TX1+ and TX1− in set 210 may also be referred to as SSTX1+ and TTTX1− pins, respectively. Starting from left to right, set 220 includes a GND pin, a RX1+ and RX1− pin, a VBUS pin, a SBU2 pin, a D− pin, a D+ pin, a CC2 pin, a VBUS pin, a TX2− pin, a TX2+ pin, and a GND pin. The TX2+ and TX2− in set 220 may also be referred to as SSTX2+ and TTTX2− pins, respectively.

In some embodiments, the size and symmetric form factor of USB subsystem 200 (e.g., USB Type-C subsystem) may increase the risk of one or more of the $V_{CONN}$, CC, and SBU pins becoming susceptible to fault currents due to neighboring high-voltage (e.g., up to 24V) $V_{BUS}$ pins. For example, if a USB-C connector is removed from a USB-C receptacle at an angle, this may cause the $V_{CONN}$, CC, or SBU pins (e.g., lines, terminal, traces, etc.) to short to the $V_{BUS}$ pins. The $V_{BUS}$ pins may have voltages as high as 25V. However, the CC or SBU pins may not be able to tolerate the higher voltage that from the CC or SBU pins. This may result in a large voltage flowing to the $V_{CONN}$, CC, or SBU pins from the $V_{BUS}$ pins which may damage other devices, circuits, components, modules, etc., that are coupled to the $V_{CONN}$, CC, or SBU pins.

Figure 3A:
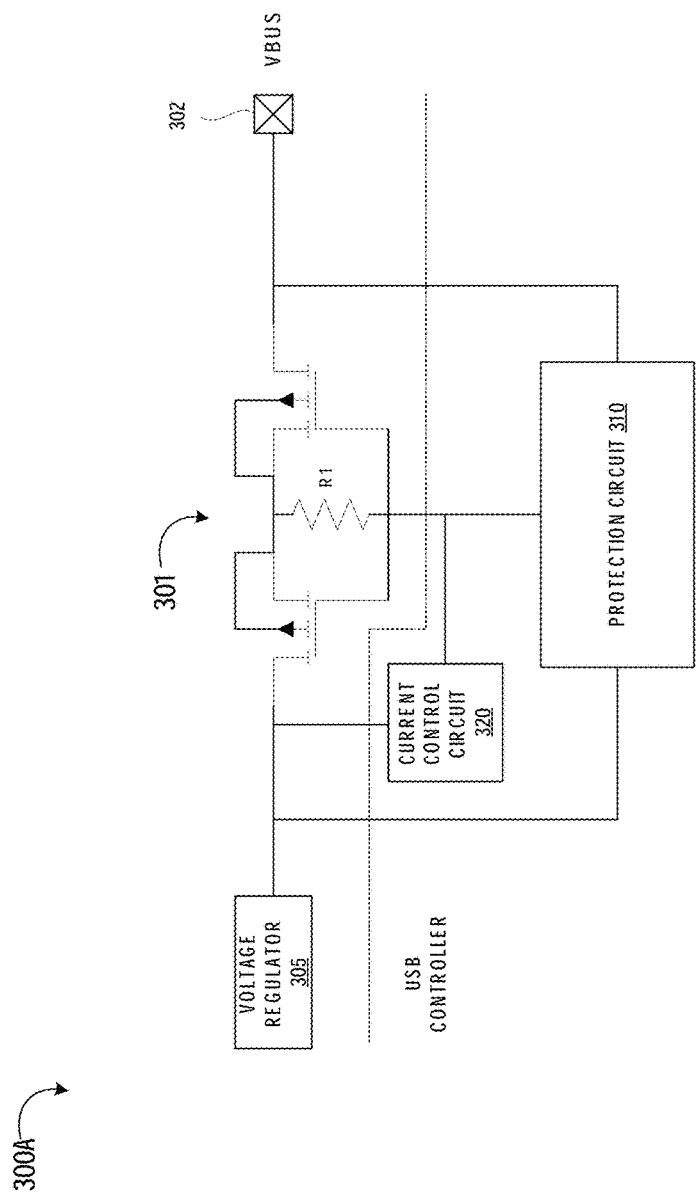
FIG. 3A is a diagram that illustrates an example power circuit, in accordance with some embodiments of the present disclosure.

FIG. 3A is a diagram that illustrates an example power circuit 300A, in accordance with some embodiments of the disclosure. In one embodiment, the power circuit 300A may be separate from a USB controller (e.g., may be a circuit, device, component, module, which is separate from a USB controller). In another embodiment, the power circuit 300A may be part of a USB controller (e.g., may be part of an example of USB-PD subsystem 120 discussed above in conjunction with FIG. 1). The power circuit 300A includes a voltage regulator 305, a power (or load) switch 301, a protection circuit 310, a current control circuit 320, and a $V_{BUS}$ terminal 302. The voltage regulator is coupled to a first terminal of the switch 301. The $V_{BUS}$ terminal 302 is coupled to a second terminal of the switch 301. The protection circuit 310 is coupled to the first terminal and the second terminal of the switch 301. The protection circuit 310 is also coupled to the switch 301 (e.g., to a gate of the switch 301) via a resistor R1. The current control circuit 320 may limit the current that flows through the switch 301. For example, the current control circuit 320 may help ensure that the current that flows through the switch 301 is less than or equal to a threshold current, as discussed in more detail below.

In one embodiment, the voltage regulator 305 may provide a voltage or a current to a first terminal of the switch 301. The switch 301 may provide the voltage or current to the second terminal and the VBUS terminal 302 when the switch 301 is on, activated, open, etc. The switch 301 may also not provide the voltage or current to the second terminal and the VBUS terminal 302 when the switch 301 is off, deactivated, closed, etc. The switch 310 may provide some or partial voltage or current to the second terminal and the VBUS terminal 302 when the switch 301 is partially on, partially activated, partially open, etc.

In one embodiment, the protection circuit 310 may be hardware (e.g., one or more circuits), software, firmware, or a combination thereof, configured to detect a reverse current condition (e.g., a condition, situation, instance, etc., when current flows from the VBUS terminal 302 towards the voltage regulator 305). The protection circuit 310 may also be configured to determine if the power circuit 300 is close to a reverse current condition, as discussed in more detail below.

In one embodiment, the protection circuit 310 may detect the voltage at the first terminal (e.g., a first voltage) and may detect the voltage at the second terminal (e.g., a second voltage). The protection circuit 310 may determine whether the second voltage is within a threshold voltage of the first voltage. For example, the protection circuit 310 may determine whether the second voltage is greater than the first voltage. In another example, the protection circuit 310 may determine whether the second voltage is within a range or less than of the first voltage.

In one embodiment, if the second voltage is within a threshold voltage of the first voltage, the protection circuit 310 may adjust the operation of the switch 301. For example, the protection circuit 310 may deactivate the switch 301. In another example, the protection circuit 310 may adjust the duty cycle of the switch 301. Adjusting the duty cycle of the switch 301 may include activating the switch 301 for a period of time and deactivating the switch 301 for a period of time. For example, the switch 301 may be activated for 8 milliseconds (ms) and may be deactivated for 2 ms (e.g., may have an 80% duty cycle). In a further example, protection circuit 310 may partially activate the switch 301. For example, the protection circuit 310 may partially activate the switch 301 such that the switch 301 allows 90% of the current or voltage that normally passes through the switch 301, to pass through to the VBUS terminal 302. In another embodiment, if the second voltage is not within a threshold of the first voltage, the protection circuit 310 may refrain from adjusting the operation of the switch 301. For example, the protection circuit 310 may not vary the duty cycle of the switch 301, may not partially activate the switch 301, may not deactivate the switch 301, etc.

The protection circuit 310 may be used to provide or control a voltage ($V_{PUMP}$) to the gate of the switch 301. In some embodiments, the voltage ($V_{PUMP}$) may be around 5V, however, other voltages may be used in other embodiments. The protection circuit 310 may be configured to control the operation of one or more charge pumps and to control the operation of the switch 301. For example, the protection circuit 310 may use charge pumps to provide the voltage $V_{PUMP}$ to the gate of the switch 301 to open the switch 301. Opening the switch 301 may allow current to flow through the switch 301. Opening the switch 301 may also be referred to as activating the switch 301, turning on the switch 301, etc. In another example, the protection circuit 310 may stop providing a voltage to the gate of the switch 301 to close the switch. Closing the switch 301 may prevent current from flowing through the switch 301. Closing the switch 301 may also be referred to as deactivating the switch 301, turning off the switch 301, etc. Partially opening the switch 301 may allow some current to flow through the switch 301. Partially opening the switch 301 may also be referred to as partially activating the switch 301, partially closing the switch 301, partially deactivating the switch 301, etc.

As discussed above, the power circuit 300A and the protection circuit 310 may be part of a USB controller. Including the power circuit 300A and the protection circuit 310 as part of the USB controller allows the total resistance of the switch 301 to be reduced. Reducing the total resistance of the switch 301 may allow the power circuit 300A or a device coupled to the power circuit 300A to operate with more power efficiency (e.g., to use less power). Including the power circuit 300A and the protection circuit 310 as part of the USB controller may also reduce the cost of the device.

Figure 3B:
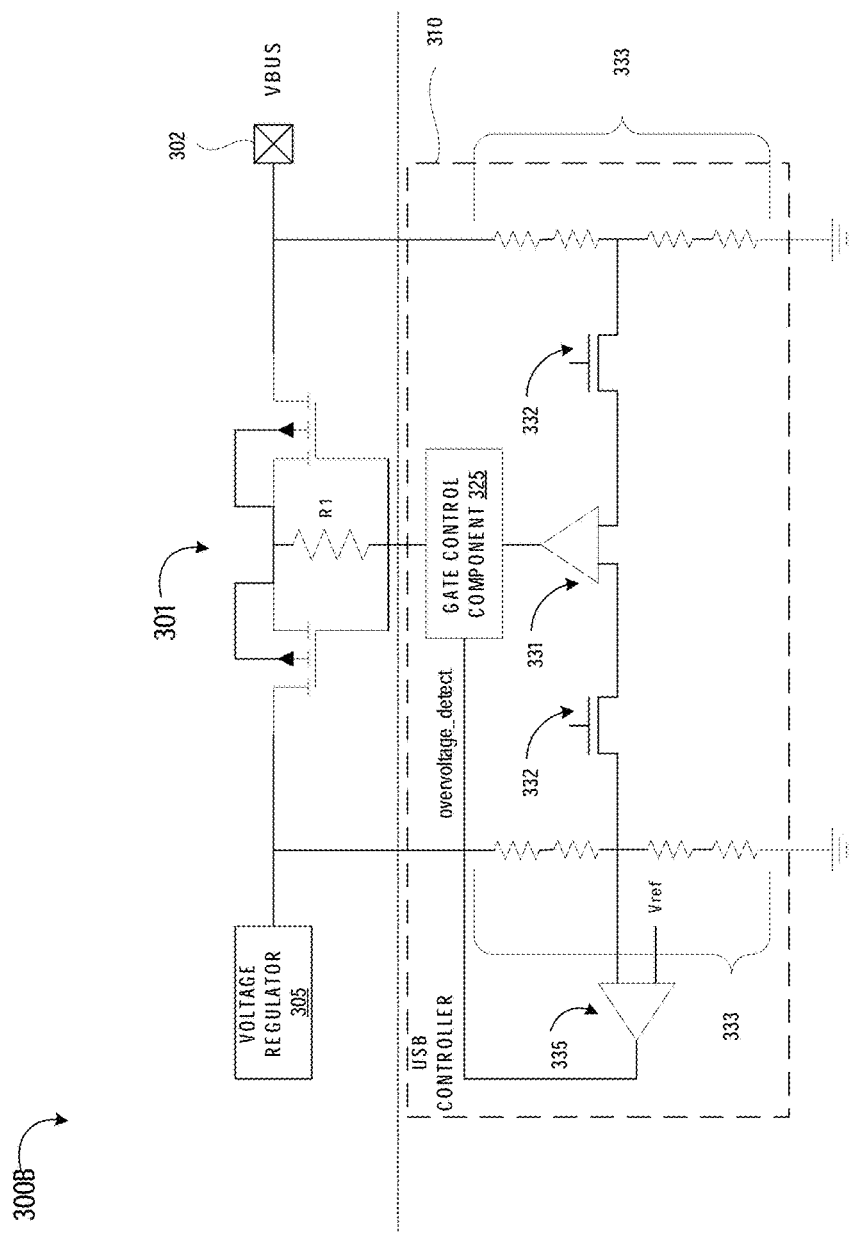
FIG. 3B is a diagram that illustrates an example power circuit, in accordance with some embodiments of the present disclosure.

FIG. 3B is a diagram that illustrates an example power circuit 300B, in accordance with some embodiments of the disclosure. In one embodiment, the power circuit 300B may be separate from a USB controller (e.g., may be a circuit, device, component, module, which is separate from a USB controller). In another embodiment, the power circuit 300B may be part of a USB controller (e.g., may be part of an example of USB-PD subsystem 120 discussed above in conjunction with FIG. 1). The power circuit 300B includes a voltage regulator 305, a switch 301, a protection circuit 310, and a VBUS terminal 302. The voltage regulator is coupled to a first terminal of the switch 301. The VBUS terminal 302 is coupled to a second terminal of the switch 301.

In one embodiment, the voltage regulator 305 may provide a voltage or a current to a first terminal of the switch 301. The switch 301 may provide the voltage or current to the second terminal and the VBUS terminal 302 when the switch 301 is on, activated, open, etc. The switch 301 may also not provide the voltage or current to the second terminal and the VBUS terminal 302 when the switch 301 is off, deactivated, closed, etc. The switch 310 may provide some or partial voltage or current to the second terminal and the VBUS terminal 302 when the switch 301 is partially on, partially activated, partially open, etc.

The protection circuit includes a comparison component 331 coupled to a gate control component 325. The comparison component 331 is coupled to the first terminal via a resistive divider 333 and a clipping circuit 332 (e.g., a diode, a diode-connected field effect transistor (FET), etc.). The comparison component 331 is also coupled to the second terminal via a resistive divider 333 and a clipping circuit 332. The clipping circuits 332 may prevent damage to the comparison component 331 by limiting the voltage that is provided to the comparison component 331. In one embodiment, the comparison component 331 may be a comparator, a digital comparator, a magnitude comparator, an operational amplifier (opamp), or some other device, circuit, module, component, etc., that may compare multiple voltages. The gate control component 325 is coupled to the switch 301 (e.g., to a gate of the switch 301) via a resistor R1.

In one embodiment, the protection circuit 310 may be hardware, software, firmware, or a combination thereof, configured to detect a reverse current condition. The comparison component 331 may detect the voltage at the first terminal (e.g., a first voltage) and may detect the voltage at the second terminal (e.g., a second voltage). The comparison component 331 may determine whether the second voltage is within a threshold voltage of the first voltage. For example, the comparison component 331 may determine whether the second voltage detected at the second terminal (that is coupled to the VBUS terminal 302) is greater than the first voltage detected at the first terminal (that is coupled to the voltage regulator 305). If the second voltage detected at the second terminal is greater than the first voltage detected at the first terminal, then a reverse current condition has occurred in the power circuit 300B (e.g., current is flowing from the VBUS node 302 towards the voltage regulator 305).

The gate control component 325 may be hardware, software, firmware, or a combination thereof, configured to adjust the operation of the switch 301. In one embodiment, if the second voltage is within a threshold voltage of the first voltage (e.g., if the second voltage is greater than the first voltage), the gate control component 325 may adjust the operation of the switch 301. For example, the gate control component 325 may deactivate the switch 301. The gate control component 325 may be used to provide or control a voltage ($V_{PUMP}$) to the gate of the switch 301. The gate control component 325 may be configured to control the operation of one or more charge pumps and to control the operation of the switch 301. For example, the gate control component 325 may use charge pumps to provide the voltage $V_{PUMP}$ to the gate of the switch 301 to open the switch 301. In another example, the gate control component 325 may stop providing a voltage to the gate of the switch 301 to close the switch. Closing the switch 301 may prevent current from flowing through the switch 301. Closing the switch 301 may also be referred to as deactivating the switch 301, turning off the switch 301, etc.

In another embodiment, if the second voltage is not within a threshold of the first voltage, the control component 325 may refrain from adjusting the operation of the switch 301. For example, the control component 325 may not vary the gate control of the switch 301, may not partially activate the switch 301, may not deactivate the switch 301, etc.

The power circuit 300B also includes a comparison component 335. The comparison component 335 may receive the voltage from the first terminal and may compare the voltage received on the first terminal with a reference voltage Vref. If the voltage at the first terminal is higher than Vref, this may indicate that an reverse current condition has occurred (e.g., the voltage at the second terminal is higher than the voltage at the first terminal). The comparison component 335 may output a signal overvoltage_detect to the gate control component 325. The gate control component 325 may turn off or deactivate the switch 301 when the overvoltage_detect signal indicates that the second voltage is higher than the first voltage (e.g., that an overcurrent condition has occurred).

In one embodiment, the protection circuit 310 may be part of a USB controller. For example, the gate control component 325, the comparison component 331, the comparison component 335, the clipping circuits 332, and the resistive dividers 333 may be part of the USB controller.

Figure 3C:
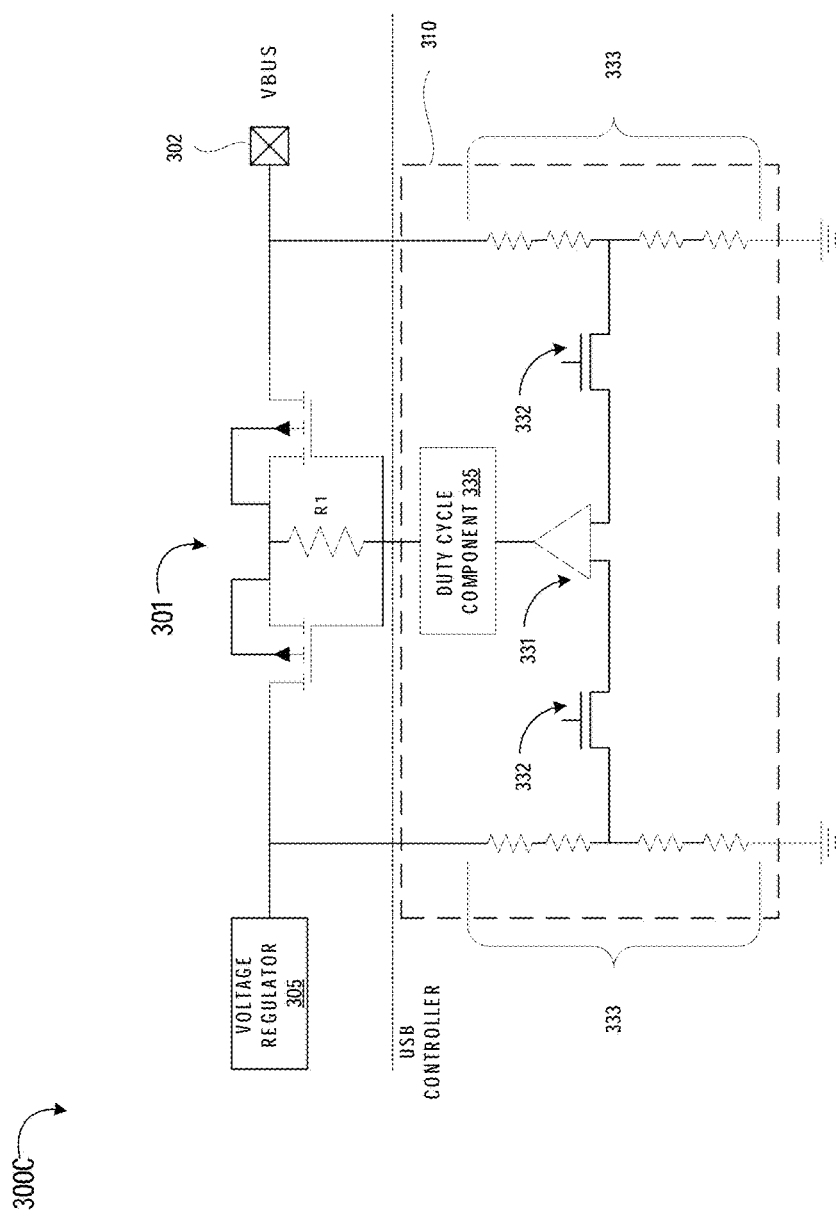
FIG. 3C is a diagram that illustrates an example power circuit, in accordance with some embodiments of the disclosure.

FIG. 3C is a diagram that illustrates an example power circuit 300C, in accordance with some embodiments of the disclosure. In one embodiment, the power circuit 300C may be separate from a USB controller (e.g., may be a circuit, device, component, module, which is separate from a USB controller). In another embodiment, the power circuit 300C may be part of a USB controller (e.g., may be part of an example of USB-PD subsystem 120 discussed above in conjunction with FIG. 1). The power circuit 300C includes a voltage regulator 305, a switch 301, an protection circuit 310, and a VBUS terminal 302. The voltage regulator is coupled to a first terminal of the switch 301. The VBUS terminal 302 is coupled to a second terminal of the switch 301.

In one embodiment, the voltage regulator 305 may provide a voltage or a current to a first terminal of the switch 301. The switch 301 may provide the voltage or current to the second terminal and the VBUS terminal 302 when the switch 301 is on, activated, open, etc. The switch 301 may also not provide the voltage or current to the second terminal and the VBUS terminal 302 when the switch 301 is off, deactivated, closed, etc. The switch 310 may provide some or partial voltage or current to the second terminal and the VBUS terminal 302 when the switch 301 is partially on, partially activated, partially open, etc.

The protection circuit includes a comparison component 331 coupled to a duty cycle component 335. The comparison component 331 is coupled to the first terminal via a resistive divider 333 and a clipping circuit 332 (e.g., a diode, a diode-connected field effect transistor (FET), etc.). The comparison component 331 is also coupled to the second terminal via a resistive divider 333 and a clipping circuit 332. The clipping circuits 332 may prevent damage to the comparison component 331 by limiting the voltage that is provided to the comparison component 331. In one embodiment, the comparison component 331 may be a comparator, an opamp, or some other device, circuit, module, component, etc., that may compare multiple voltages. The duty cycle component 335 is coupled to the switch 301 (e.g., to a gate of the switch 301) via a resistor R1.

In one embodiment, the protection circuit 310 may be hardware, software, firmware, or a combination thereof, configured to detect a reverse current condition. The comparison component 331 may detect the voltage at the first terminal (e.g., a first voltage) and may detect the voltage at the second terminal (e.g., a second voltage). The comparison component 331 may determine whether the second voltage is within a threshold voltage of the first voltage. For example, the comparison component 331 may determine whether the second voltage detected at the second terminal (that is coupled to the VBUS terminal 302) is greater than the first voltage detected at the first terminal (that is coupled to the voltage regulator 305. If the second voltage detected at the second terminal is greater than the first voltage detected at the first terminal, then a reverse current condition has occurred in the power circuit 300C (e.g., current is flowing from the VBUS node 302 towards the voltage regulator 305.

The comparison component 331 may also determine whether the second voltage is within one or more ranges of voltages (e.g., ranges of thresholds) of the first voltage. For example, the second voltage may be within 1 millivolt (mV) to 10 mV of the first voltage (e.g., the second voltage may be 1 mV to 10 mV less than the first voltage). In another example, the second voltage may be within 31 mV to 40 mV of the first voltage (e.g., the second voltage may be 31 mV to 40 mV less than the first voltage). In a further example, the second voltage may be within 61 mV to 70 mV of the first voltage (e.g., the second voltage may be 61 mV to 70 mV less than the first voltage).

The duty cycle component 335 may be hardware, software, firmware, or a combination thereof, configured to adjust the operation of the switch 301. The duty cycle component 335 may be used to provide or control a voltage ($V_{PUMP}$) to the gate of the switch 301. The duty cycle component 335 may be configured to control the operation of one or more charge pumps and to adjust the duty cycle of the switch 301. For example, the duty cycle component 335 may use charge pumps to provide the voltage $V_{PUMP}$ to the gate of the switch 301 to open the switch 301. In another example, the duty cycle component 335 may stop providing a voltage to the gate of the switch 301 to close the switch. Closing the switch 301 may prevent current from flowing through the switch 301. Closing the switch 301 may also be referred to as deactivating the switch 301, turning off the switch 301, etc.

In one embodiment, if the second voltage is within a threshold voltage of the first voltage (e.g., if the second voltage is greater than the first voltage), the duty cycle component 335 may adjust the operation of the switch 301. For example, the duty cycle component 335 may adjust the duty cycle of the switch 301. Adjusting the amount of time that the switch 301 is activated may be referred to as adjusting the duty cycle of the switch 301. For example, if the switch 301 has a 75% duty cycle then the switch 301 may be activated 75% of the time.

In one embodiment, the duty cycle component 335 may adjust the duty cycle of the switch 301 based on whether the second voltage is within one or more ranges of voltages (e.g., ranges of thresholds) of the first voltage. The duty cycle component 335 may operate the switch 301 with different duty cycles based different ranges of voltages. For example, if the second voltage is 61 mV to 70 mV less than the first voltage, the duty cycle component 335 may operate the switch 301 with a 90% duty cycle. In another example, if the second voltage is 1 mV to 10 mV less than the first voltage, the duty cycle component 335 may operate the switch 301 with a 20% duty cycle (e.g., the switch 301 may be deactivated 80% of the time). In a further example, if the second voltage is higher than the first voltage, the duty cycle component 335 may deactivate the switch completely (e.g., may operate the switch with a 0% duty cycle). Varying the duty cycle of the switch 301 may allow the power circuit 300C to avoid a sudden or abrupt deactivation of the switch 301. This may allow components that are coupled to the power circuit 300 to continue operating up until the switch 301 is completely deactivated or closed.

In another embodiment, if the second voltage is—within a threshold of the first voltage, the control component 325 may refrain from adjusting the operation of the switch 301. For example, the control component 325 may not vary duty cycle of the switch 301, may not partially activate the switch 301, may not deactivate the switch 301, etc.

In some embodiments, the duty cycle component 335 may be programmable. For example, the duty cycle component 335 may receive input, signals, messages, packets, frames, etc., that may indicate different ranges of voltages. The input, signals, messages, packets, frames, etc., may also indicate the duty cycles for the different ranges. In other embodiments, the comparison component 331 may also be programmable. For example, the comparison component 331 may be programmed to detect different voltages.

In one embodiment, the protection circuit 310 may be part of a USB controller. For example, the duty cycle component 335, the comparison component 331, the clipping circuits 332, and the resistive dividers 333 may be part of the USB controller.

Figure 3D:
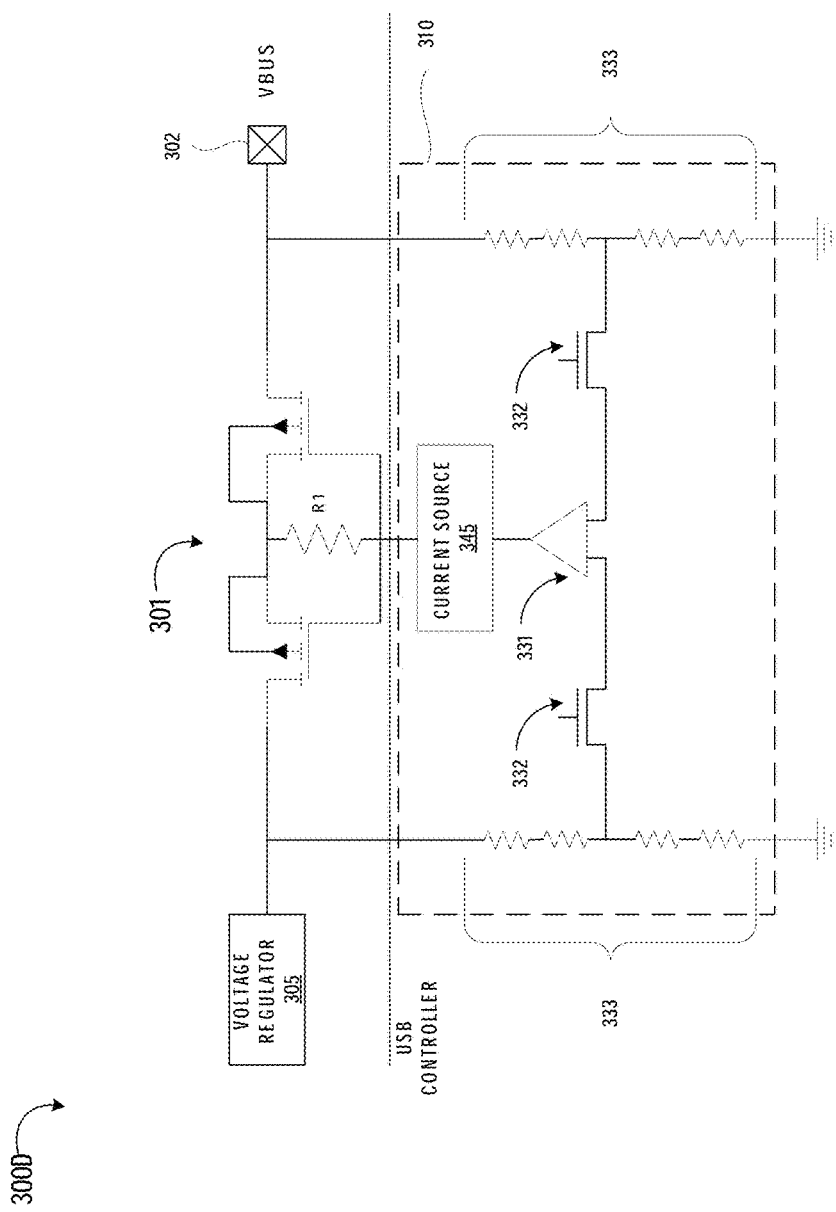
FIG. 3D is a diagram that illustrates an example power circuit, in accordance with some embodiments of the disclosure.

FIG. 3D is a diagram that illustrates an example power circuit 300D, in accordance with some embodiments of the disclosure. In one embodiment, the power circuit 300D may be separate from a USB controller (e.g., may be a circuit, device, component, module, which is separate from a USB controller). In another embodiment, the power circuit 300D may be part of a USB controller (e.g., may be part of an example of USB-PD subsystem 120 discussed above in conjunction with FIG. 1). The power circuit 300D includes a voltage regulator 305, a switch 301, an protection circuit 310, and a VBUS terminal 302. The voltage regulator is coupled to a first terminal of the switch 301. The VBUS terminal 302 is coupled to a second terminal of the switch 301.

In one embodiment, the voltage regulator 305 may provide a voltage or a current to a first terminal of the switch 301. The switch 301 may provide the voltage or current to the second terminal and the VBUS terminal 302 when the switch 301 is on, activated, open, etc. The switch 301 may also not provide the voltage or current to the second terminal and the VBUS terminal 302 when the switch 301 is off, deactivated, closed, etc. The switch 310 may provide some or partial voltage or current to the second terminal and the VBUS terminal 302 when the switch 301 is partially on, partially activated, partially open, etc.

The protection circuit includes a comparison component 331 coupled to a current source 345. The comparison component 331 is coupled to the first terminal via a resistive divider 333 and a clipping circuit 332 (e.g., a diode, a diode-connected field effect transistor (FET), etc.). The comparison component 331 is also coupled to the second terminal via a resistive divider 333 and a clipping circuit 332. The clipping circuits 332 may prevent damage to the comparison component 331 by limiting the voltage that is provided to the comparison component 331. In one embodiment, the comparison component 331 may be a comparator, an opamp, or some other device, circuit, module, component, etc., that may compare multiple voltages. The current source 345 is coupled to the switch 301 (e.g., to a gate of the switch 301) via a resistor R1.

In one embodiment, the protection circuit 310 may be hardware, software, firmware, or a combination thereof, configured to detect a reverse current condition. The comparison component 331 may detect the voltage at the first terminal (e.g., a first voltage) and may detect the voltage at the second terminal (e.g., a second voltage). The comparison component 331 may determine whether the second voltage is within a threshold voltage of the first voltage. For example, the comparison component 331 may determine whether the second voltage detected at the second terminal (that is coupled to the VBUS terminal 302) is greater than the first voltage detected at the first terminal (that is coupled to the voltage regulator 305. If the second voltage detected at the second terminal is greater than the first voltage detected at the first terminal, then a reverse current condition has occurred in the power circuit 300D (e.g., current is flowing from the VBUS node 302 towards the voltage regulator 305.

The comparison component 331 may also determine whether the second voltage is within one or more ranges of voltages (e.g., ranges of thresholds) of the first voltage. For example, the second voltage may be within 1 millivolt (mV) to 10 mV of the first voltage (e.g., the second voltage may be 1 mV to 10 mV less than the first voltage). In another example, the second voltage may be within 31 mV to 40 mV of the first voltage (e.g., the second voltage may be 31 mV to 40 mV less than the first voltage). In a further example, the second voltage may be within 61 mV to 70 mV of the first voltage (e.g., the second voltage may be 61 mV to 70 mV less than the first voltage).

The current source 345 may be hardware, software, firmware, or a combination thereof, configured to adjust the operation of the switch 301. The current source 345 may be used to provide or control a voltage ($V_{PUMP}$) to the gate of the switch 301. The current source 345 may be configured to control the operation of one or more charge pumps and to partially activate or partially deactivate the switch 301. For example, the current source 345 may use charge pumps to provide the voltage $V_{PUMP}$ to the gate of the switch 301 to open the switch 301. In another example, the current source 345 may reduce $V_{PUMP}$ to partially activate or partially open the switch 301. Partially closing or partially deactivating the switch 301 may allow some (e.g., a percentage) of the current or voltage from the voltage regulator 305 to flow through the switch to the VBUS node 302. Closing the switch 301 completely may prevent current from flowing through the switch 301. Completely closing the switch 301 may also be referred to as deactivating the switch 301, turning off the switch 301, etc.

In one embodiment, if the second voltage is within a threshold voltage of the first voltage (e.g., if the second voltage is greater than the first voltage), the current source 345 may adjust the operation of the switch 301. For example, the current source 345 may partially activate or partially open the switch 301 to different levels.

In one embodiment, the current source 345 may adjust the level or the amount that the switch 301 is open based on whether the second voltage is within one or more ranges of voltages (e.g., ranges of thresholds) of the first voltage. For example, the current source 345 may open the switch 301 to different levels or amounts based different ranges of voltages. For example, if the second voltage is 61 mV to 70 mV less than the first voltage, the current source 345 may partially open the switch 301 to 90% (e.g., may allow 90% of the current or voltage from the voltage regulator 305 through the switch 301). In another example, if the second voltage is 1 mV to 10 mV less than the first voltage, the current source 345 may partially open the switch 301 to 20% (e.g., may allow 20% of the current or voltage from the voltage regulator 305 through the switch 301). In a further example, if the second voltage is higher than the first voltage, the current source 345 may deactivate the switch completely (e.g., may allow 0% of the current or voltage from the voltage regulator 305 through the switch 301).

Partially activating the switch 301 may allow the power circuit 300D to avoid a sudden or abrupt deactivation of the switch 301. This may allow components that are coupled to the power circuit 300 to continue operating up until the switch 301 is completely deactivated or closed.

In another embodiment, if the second voltage is not within a threshold of the first voltage, the control component 325 may refrain from adjusting the operation of the switch 301. For example, the control component 325 may not vary duty cycle of the switch 301, may not partially activate the switch 301, may not deactivate the switch 301, etc.

In some embodiments, the current source 345 may be programmable. For example, the current source 345 may receive input, signals, messages, packets, frames, etc., that may indicate different $V_{PUMP}$ voltages that may be provided to the gate of the switch 301. The input, signals, messages, packets, frames, etc., may also indicate the different ranges of voltages that are associated with the different $V_{PUMP}$ voltages. In other embodiments, the comparison component 331 may also be programmable. For example, the comparison component 331 may be programmed to detect different voltages.

In one embodiment, the protection circuit 310 may be part of a USB controller. For example, the current source 345, the comparison component 331, the clipping circuits 332, and the resistive dividers 333 may be part of the USB controller.

Figure 4:
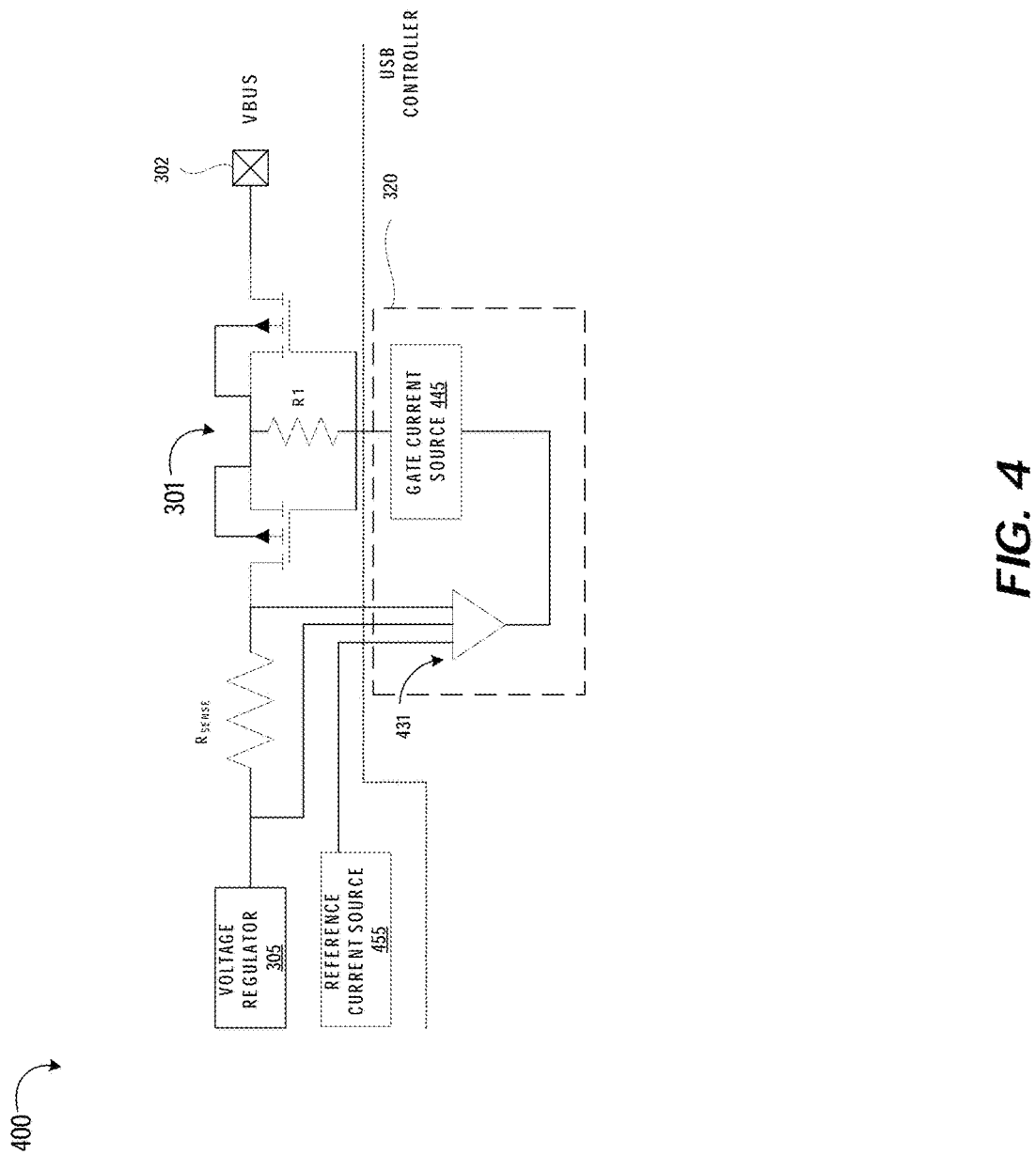
FIG. 4 is a diagram that illustrates an example power circuit, in accordance with some embodiments of the present disclosure.

FIG. 4 is a diagram that illustrates an example power circuit 400, in accordance with some embodiments of the present disclosure. In one embodiment, the power circuit 400 may be separate from a USB controller (e.g., may be a circuit, device, component, module, which is separate from a USB controller). In another embodiment, the power circuit 400 may be part of a USB controller (e.g., may be part of an example of USB-PD subsystem 120 discussed above in conjunction with FIG. 1). The power circuit 400 includes a voltage regulator 305, a reference current source 455, a switch 301, a current control circuit 320, and a VBUS terminal 302. The voltage regulator is coupled to a first terminal of the switch 301. The VBUS terminal 302 is coupled to a second terminal of the switch 301. In one embodiment, the current control circuit 320 may be hardware, software, firmware, or a combination thereof, configured to detect when the current from the voltage regulator 305 is greater than a threshold current and to limit or reduce the current from the voltage regulator 305 that flows through the switch 301. When the current from the voltage regulator 305 is greater than a threshold current, this may be referred to as an overcurrent condition (e.g., a condition where more than the threshold current is flowing through switch 301). The threshold current may be programmable and may be received from a device coupled to a USB controller (e.g., a device that is receiving current from the voltage regulator 305).

In one embodiment, the voltage regulator 305 may provide a voltage or a current to a first terminal of the switch 301. The switch 301 may provide the voltage or current to the second terminal and the VBUS terminal 302 when the switch 301 is on, activated, open, etc. The switch 301 may also not provide the voltage or current to the second terminal and the VBUS terminal 302 when the switch 301 is off, deactivated, closed, etc. The switch 310 may provide some or partial voltage or current to the second terminal and the VBUS terminal 302 when the switch 301 is partially on, partially activated, partially open, etc.

In one embodiment, the reference current source 455 may provide a reference current that may be used to limit the current from the voltage regulator 305. For example, the current from the voltage regulator 305 may be compared with the reference current generated by the reference current source 455. The reference current source 455 may be programmable. For example, the current generated by the reference current source 455 may be changed/adjusted via programming.

The current control circuit 320 includes a comparison component 431 coupled to a current source 445. The comparison component 431 is coupled to voltage regulator 305 and the reference current source 455. The comparison component 431 is also coupled to gate current source 445. The component 431 is also connected across series resistance $R_{SENSE}$ that may be used for current direction sensing. When a reverse current condition occurs, the current flows from the terminal 302 to the voltage regulator 305. In some embodiments, the comparison component 431 may cause the switch 301 to deactivate or turn off. In other embodiments, the comparison component 431 may cause the switch 301 to be partially activated (e.g., partially turned on, based on the magnitude of voltage across $R_{SENSE}$. Although a gate current source 445 is illustrated in FIG. 4, a gate control component (e.g., gate control component 325 illustrated in FIG. 3B) or a duty cycle component (e.g., duty cycle component 335 illustrated in FIG. 3C) may be used to adjust the operation of the switch 301. In one embodiment, the comparison component 431 may be a current sense amplifier (CSA), or some other device, circuit, module, component, etc., that may compare multiple currents. The gate current source 445 is coupled to the switch 301 (e.g., to a gate of the switch 301) via a resistor R1.

The comparison component 431 may detect the current from the voltage regulator 305 and the current from the reference current source 455. If the current from the voltage regulator 305 is greater than the reference current, the comparison component 431 may output signals, messages, bits, etc., to the gate current source 445 to indicate that the current from the voltage regulator 305 is greater than the reference current. If the current from the voltage regulator 305 is less than or equal to the reference current, the comparison component 431 may output signals, messages, bits, etc., to the gate current source 445 to indicate that the current from the voltage regulator 305 is less than or equal to the reference current.

The gate current source 445 may be hardware, software, firmware, or a combination thereof, configured to adjust the operation of the switch 301. The gate current source 445 may be used to provide or control a voltage ($V_{PUMP}$) to the gate of the switch 301. The gate current source 445 may be configured to control the operation of one or more charge pumps and to partially activate or partially deactivate the switch 301. For example, the gate current source 445 may use charge pumps to provide the voltage $V_{PUMP}$ to the gate of the switch 301 to open the switch 301. In another example, the gate current source 445 may reduce $V_{PUMP}$ to partially activate or partially open the switch 301. Partially closing or partially deactivating the switch 301 may allow some (e.g., a percentage) of the current or voltage from the voltage regulator 305 to flow through the switch to the VBUS node 302. This may allow the gate current source 445 to reduce or limit the amount of voltage that flows through the switch 301.

In one embodiment, the gate current source 445 may partially activate the switch 301 until the current flowing through the switch 301 is less than or equal to the reference or the threshold current (generated by the reference current source 455) for a period of time. The period of time may be adjustable or programmable. If the current flowing through the switch 301 is less than or equal to the reference current (e.g., the threshold current)) for a period of time, the gate current source 445 may activate or open the switch 301 more, until the switch 301 is completely activated or opened.

In some embodiments, the gate current source 445 may be programmable. For example, the gate current source 445 may receive input, signals, messages, packets, frames, etc., that may indicate different $V_{PUMP}$ voltages that may be provided to the gate of the switch 301. The input, signals, messages, packets, frames, etc., may also indicate the different ranges of voltages that are associated with the different $V_{PUMP}$ voltages. In other embodiments, the comparison component 431 may also be programmable. For example, the comparison component 431 may be programmed to detect different current.

In one embodiment, the current control circuit 320 may be part of a USB controller. For example, the gate current source 445 and the comparison component 431 may be part of the USB controller.

In one embodiment, the current control circuit 320 may include one or more of a gate control component (e.g., similar to gate control component 325 illustrated in FIG. 3B), a duty cycle component (e.g., similar to duty cycle component 335 illustrated in FIG. 3C). The gate control component may activate or deactivate the switch 301, as discussed above. Deactivating the switch 301 may reduce or eliminate the overcurrent condition. The duty cycle component may change the duty cycle of the switch 301, as discussed above. Adjusting the duty cycle of the switch 301 may effectively increase the resistance of the switch may reduce or eliminate the overcurrent condition.

In different embodiments, one or more of the protection circuit 310, the current control circuit 320, the gate control component 325, the comparison component 331, the duty cycle component 335, the current source 345, the reference current source 455, the comparison component 431, and the gate current source 445 may be programmed in various different ways. For example, a non-volatile memory or an array of storage elements may be used to store configuration data, such as configurations or settings for the gate current source 445. In various implementations and embodiments, the configuration data may be stored in any suitable volatile and/or non-volatile storage that may include, but is not limited to, an array of storage elements, a re-programmable flash memory, re-programmable or one-time programmable (OTP) registers, a RAM array, and an array of data flops. In some embodiments the firmware instructions and its data may be stored on-chip, while in other embodiments some (or all) of the firmware instructions and its data may be stored in an external memory (e.g., serial EEPROM) and may be executed-in-place or may be read and loaded into the volatile memory of IC controller 100 prior to execution or at certain operational events (e.g., at power on or reset).

It should be understood that various embodiments may provide various mechanisms to facilitate the re-configurabilty and/or re-programmability of a USB controller (and of its various components) that operates in accordance with the techniques described herein. For example, some embodiments may store configuration and/or program data in logic circuits that are enabled/disabled by using resistor-based fuses that are trimmed when the USB controller is manufactured. Examples of such fuses include laser fuses, e-fuses, and non-volatile latches that have some characteristics of fuses and some characteristics of non-volatile memory. In some embodiments, pin-strapping may be used to facilitate the programmability of the USB controller. A pin-strapping mechanism may involve connecting (e.g., via jumpers or PCB traces) a number of controller pins/terminals to power or ground to have each input provide a binary value to the USB controller, where the collection of the provided input values is used configuration data to configure or program one or more components of the controller. In some embodiments, the configuration data for programming the USB controller may be stored as a resistor configuration storage. For example, a set of resistors may be connected between a set of pins/terminals of the USB controller and power or ground, to create a voltage or current that can be measured by an ADC to produce a binary value to configure one or more parameters of the controller. In other embodiments, the configuration data for programming the USB controller may be provided as a mask ROM or a metal mask. For example, a chip manufacturer can customize a particular batch of USB controller chips by changing the connections of pre-defined internal nodes between a "1" and a "0" using a single lithographic mask that is specific to that custom configuration with other masks remaining unchanged between batches, thereby providing custom configuration parameters for the particular batch of controllers.

It should be understood that various embodiments may provide various types of programmability for an USB controller (and of its components) that operates in accordance with the techniques described herein. For example, some embodiments may provide dynamic programmability, in which configuration changes are re-programmed in the course of normal operation of the USB controller, usually (but not necessarily always) in response to a change in one or more operating conditions or an external command and based on data previously programmed into the controller. Other embodiments may use in-system programmability, in which configuration changes are re-programmed in the course of normal operation of the USB controller in response to an external command and based on new configuration data downloaded into the controller in association of the command. In some embodiments, the USB controller may be factory-programmed as part of its manufacture or as part of the manufacture of an end product (e.g., such as a power adapter, a wall socket, a car charger, a power bank, etc.). For example, the IC controller may be programmed during manufacture by using various mechanisms such as firmware instructions stored in non-volatile memory, pin-strapping, resistor programming, laser-trimmed fuses, NV latches, or OTP registers.

Figure 5A:
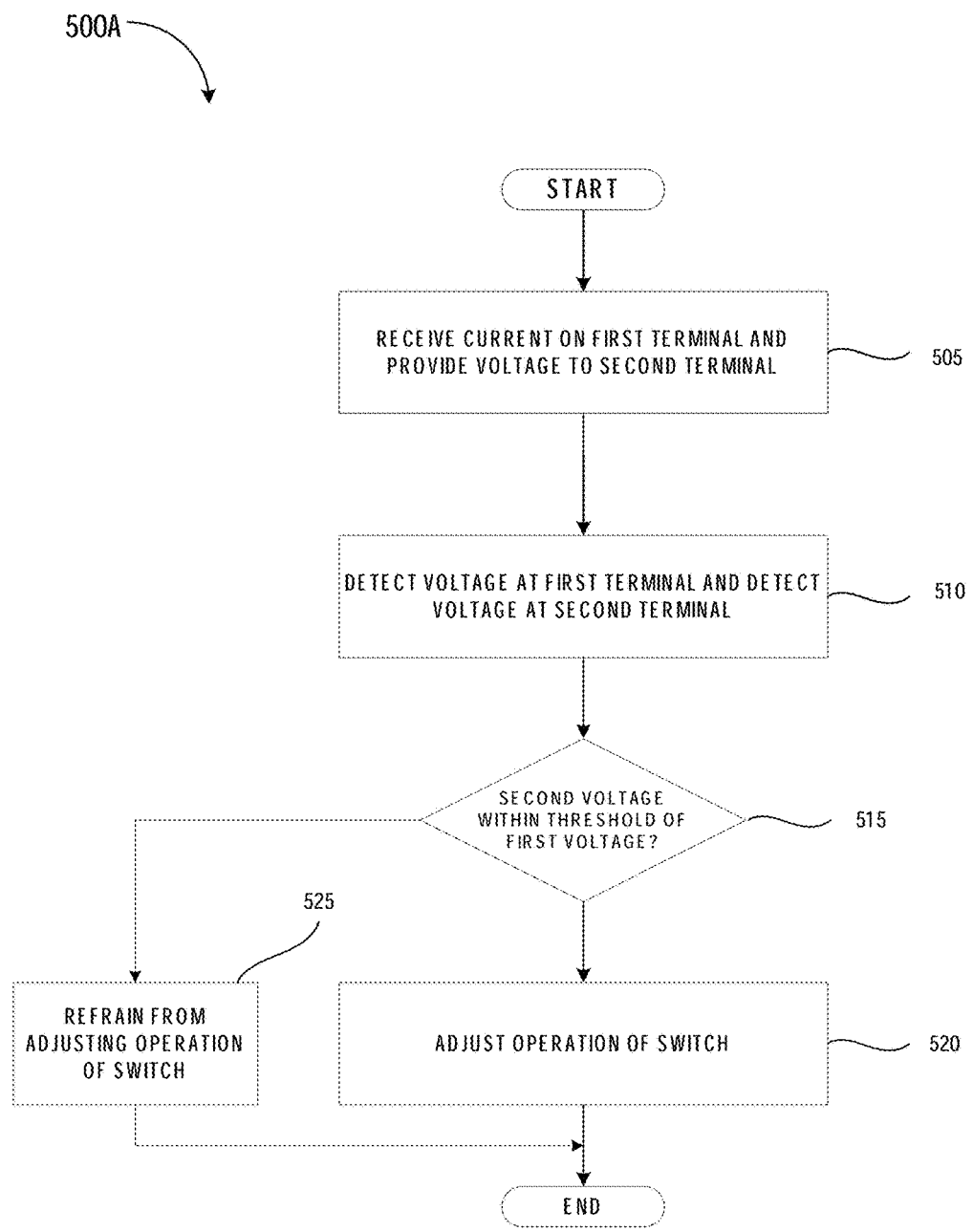
FIG. 5A is a flow diagram of a method of providing reverse current protection for USB-C connector systems, in accordance with some embodiments of the present disclosure.

FIG. 5A is a flow diagram of a method 500A of providing reverse current protection for USB-C connector systems, in accordance with some embodiments of the present disclosure. Method 500A may be performed by processing logic that may comprise hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 500A may be performed by a USB-PD subsystem (e.g., USB-PD subsystem 120 illustrated in FIG. 1), a USB controller, an protection circuit, etc.

The method 500A may begin at block 505 with receiving a current on a first terminal and providing the current to the second terminal via a switch. The first terminal may be coupled to a voltage regulator and the second terminal may be coupled to a VBUS terminal of a USB-C connector. At block 510, the method 500A may detect a first voltage at the first terminal and a second voltage at a second terminal. At block 515, the method 500A may determine whether the second voltage is within a threshold voltage of the first voltage. For example, the method 500A may determine whether the second voltage is greater than the first voltage, as discussed above. In another example, the method 500A may determine whether the second voltage is within a range of voltages, as discussed above.

If the second voltage is within a threshold of the first voltage, the method 500A may adjust the operation of the switch at block 520. For example, the method 500A may deactivate (e.g., close) the switch, as discussed above. In another example, the method 500A may partially activate the switch, as discussed above. If the second voltage is not within a threshold of the first voltage, the method 500A may refrain from adjusting the operation of the switch. For example, the method 500A may allow the switch to remain completely open.

Figure 5B:
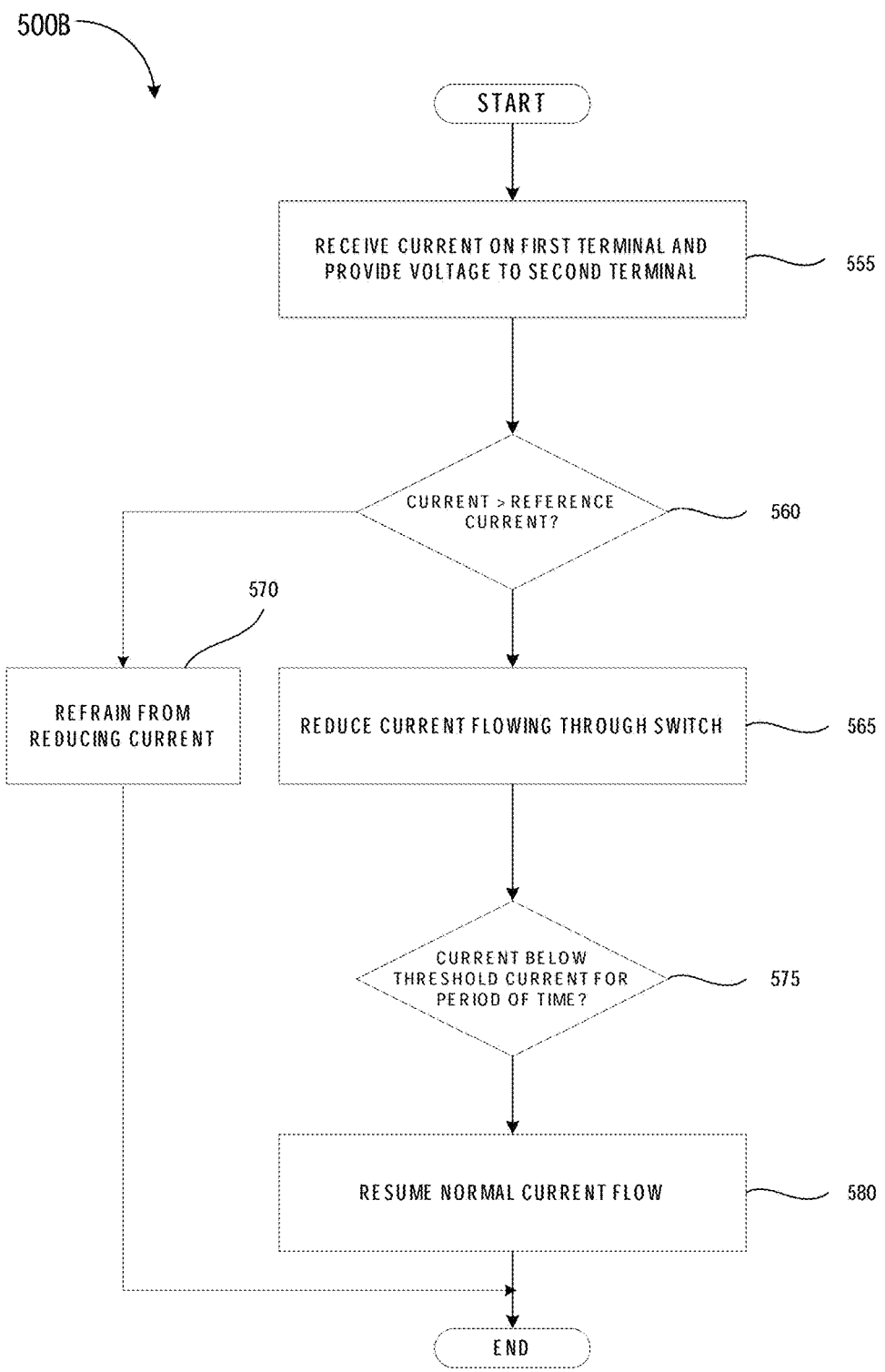
FIG. 5B is a flow diagram of a method of limiting current for USB-C connector systems, in accordance with some embodiments of the present disclosure.

FIG. 5B is a flow diagram of a method 500B of limiting current for USB-C connector systems, in accordance with some embodiments of the present disclosure. Method 500B may be performed by processing logic that may comprise hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 500B may be performed by a USB-PD subsystem (e.g., USB-PD subsystem 120 illustrated in FIG. 1), a USB controller, a current control circuit, etc.

The method 500B may begin at block 555 with receiving a current on a first terminal and providing the current to the second terminal via a switch. The first terminal may be coupled to a voltage regulator and the second terminal may be coupled to a VBUS terminal of a USB-C connector. At block 560, the method 500B may whether the current received at the first terminal is greater than a reference current, as discussed above.

If the current received at the first terminal is greater than a reference current, the method 500B may reduce the current flowing through the switch at block 565. For example, the method 500B may partially activate the switch, as discussed above. If the current received at the first terminal is not greater than a reference current, the method 500B may refrain from reducing the current flowing through the switch at block 570. For example, the method 500B may allow the switch to remain completely open.

At block 575, the method 500B may determine whether the current has remained below the threshold current for a period of time (e.g., 1 ms, 100 ms, 1 second, etc.). If the current has remained below the threshold current for the period of time, the method 500 may resume the normal current flow for the switch at block 580.

Figure 6A:
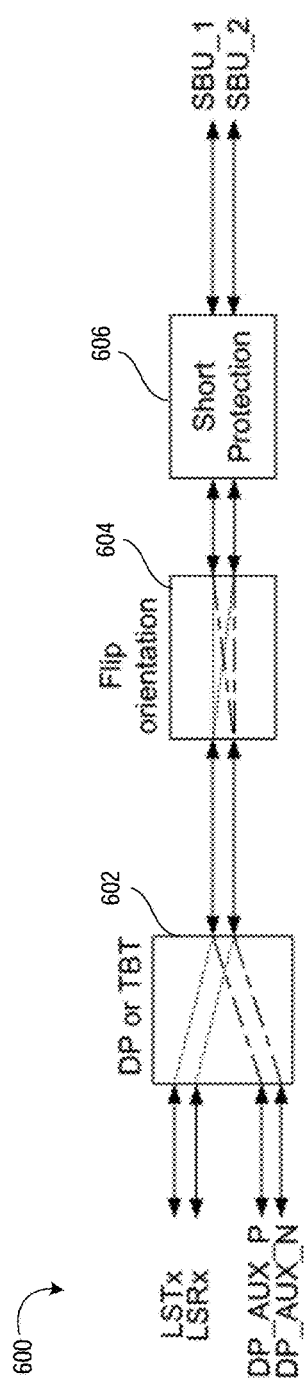
FIG. 6A is a block diagram of a SBU crossbar switch for USB-C connector systems, in accordance with some embodiments of the present disclosure.
Figure 6B:
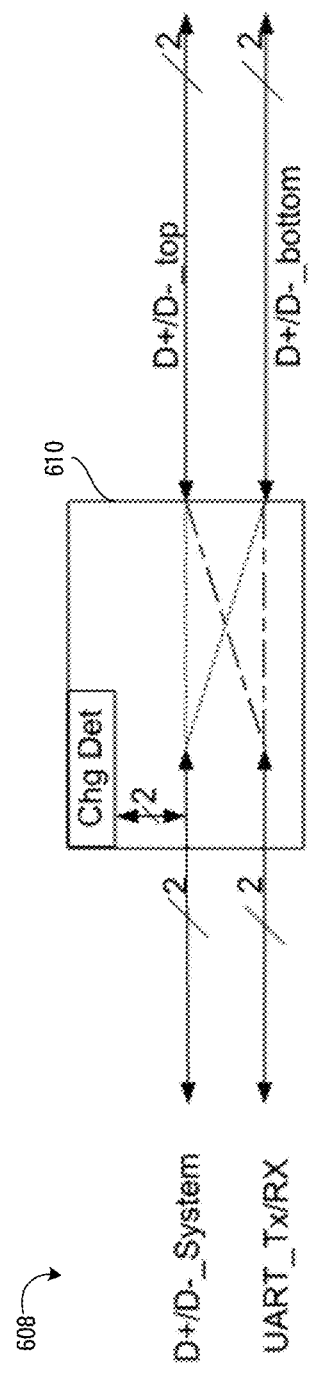
FIG. 6B is a block diagram of a DP/DM switch for USB-C connector systems, in accordance with some embodiments of the present disclosure.

FIG. 6A is a block diagram of a SBU crossbar switch 600 for USB-C connector systems, in accordance with some embodiments of the present disclosure. FIG. 6B is a block diagram of a DP/DM switch 608 for USB-C connector systems, in accordance with some embodiments of the present disclosure. In certain embodiments, as illustrated by FIGS. 6A and 6B, it may be useful to describe the present techniques with respect to a block diagram of a SBU crossbar switch 600 as illustrated by FIG. 6A and a block diagram of a DP/DM switch 608 as illustrated in FIG. 6B. For example, the SBU crossbar switch 600 may include a SBU switch MUX (e.g., 2×1 MUX) and a single 2×2 cross bar SBU switch per the Type-C port. In some embodiments, as further illustrated by FIG. 6A, the SBU crossbar switch 600 may include Display Port (DP) or Thunderbolt (TBT) block 602 that may allow selections between the Display Port or Thunderbolt modes and the routing signals to the appropriate SBU1 and/or SUB2 based on CC (e.g., Type-C plug) orientation (e.g., via either orientation) as determined by a flip orientation block 604. In some embodiments, in accordance with the present techniques, the fault protection block 606 of the SBU crossbar switch 600 and the Chg/Det block 610 of the DP/DM switch 608 may be provided the overcurrent protection schemes or functionality as discussed herein (e.g., implemented for each orientation and each direction of signal path).

USB Type-C Example Applications

The techniques for overcurrent and overvoltage protection described herein may be embodied in several different types of USB Type-C applications. Examples of such types of Type-C applications include, but may not be limited to: a downstream facing port (DFP) USB application, in which an IC controller with a USB Type-C subsystem is configured to provide a downstream-facing USB port (e.g., in a USB-enabled host device); an upstream facing port (UFP) USB application, in which an IC controller with a USB Type-C subsystem may be utilized to provide an upstream-facing USB port (e.g., in a USB-enabled peripheral device or adapter); and a dual role port (DRP) USB application, in which an IC controller with a USB Type-C subsystem is configured to support both DFP and UFP applications on the same USB port.

Figure 7:
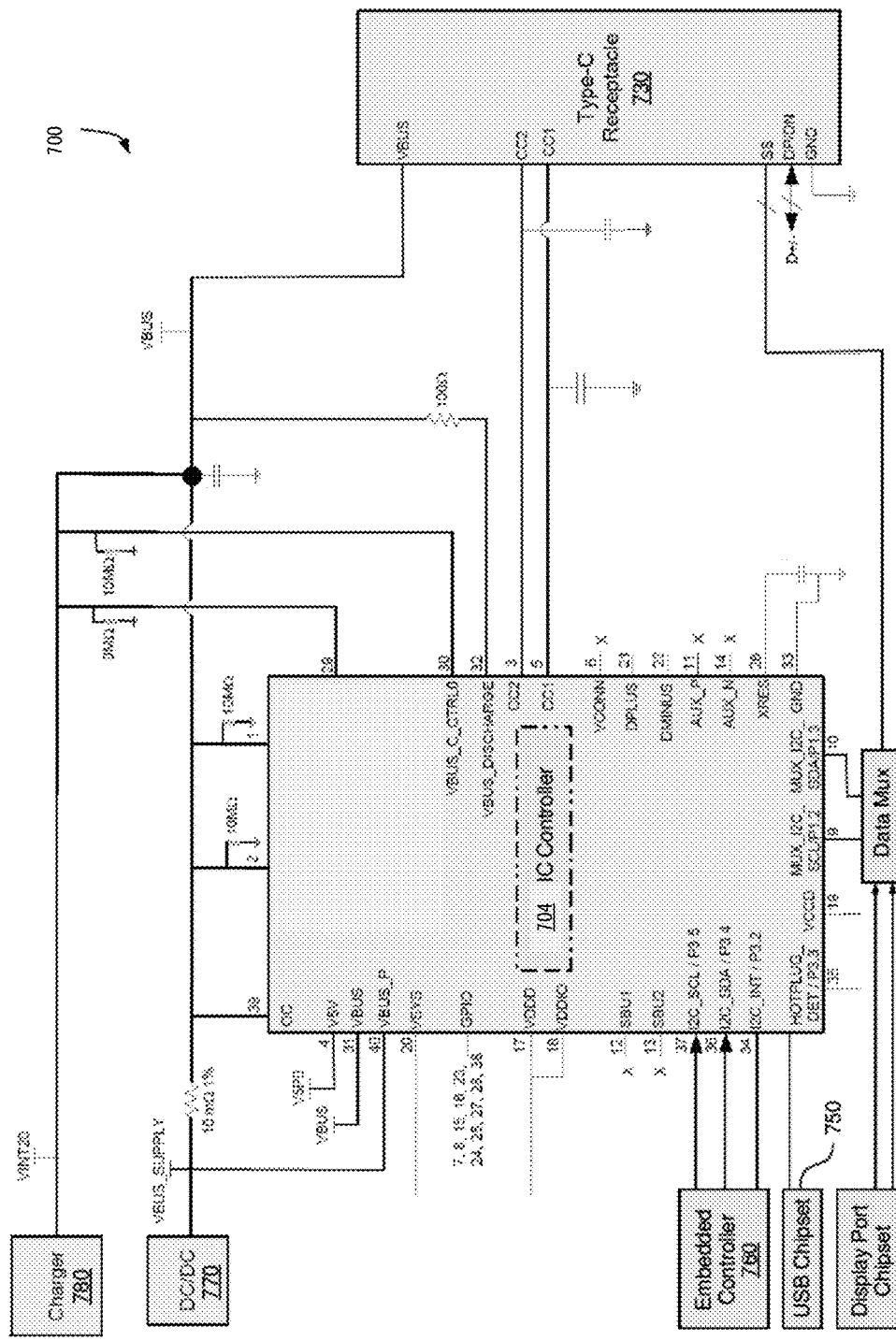
FIG. 7 is a block diagram of an example apparatus that may perform one or more of the operations described herein, in accordance with some embodiments of the present disclosure.

FIG. 7 illustrates an example system 700 in which IC controller 704 with a USB-PD subsystem is configured to provide a DRP application. In an example embodiment, IC controller 704 may be a single-chip IC device from the family of CCGx USB controllers developed by Cypress Semiconductor Corporation, San Jose, Calif. In system 700, IC controller 704 is coupled to Type-C receptacle 730, to display port chipset 740, to USB chipset 750, to embedded controller 760, to power supply 770, and to charger 780. These components of system 700 may be disposed on a printed circuit board (PCB) or other suitable substrate, and are coupled to each other by suitable means such conductive lines, traces, buses, etc.

In certain embodiments, the Type-C receptacle 730 may be configured in accordance with a USB Type-C specification to provide connectivity through a Type-C port. Display port chipset 740 is configured to provide a DisplayPort functionality through the Type-C receptacle 730. USB chipset 750 is configured to provide support for USB communications (e.g., such as USB 2.0 communications) through the D+/− lines of Type-C receptacle 730. Embedded controller 760 is coupled to IC controller 704 and is configured to provide various control and/or data transfer functions in system 700. The Power supply 770 may include a DC/DC power source that is coupled to the IC controller 704.

In certain embodiments, as previously discussed above, the IC controller 704 may include overcurrent detection and protection circuitry to carry out the overcurrent techniques as described above. For example, as illustrated in FIG. 7, because the overcurrent detection and protection circuitry is constructed as part of the IC controller 704 (e.g., on-chip), in some embodiments, singular PHY control channels may couple the respective CC1 and CC2 terminals of the IC controller 704 via a "direct connection" (e.g., which may herein refer to an electric connection via or including a passive component such as a resistor or capacitor, but without any electrical connection via an active component such as a diode or transistor) to the respective CC1 and CC2 terminals of the Type-C receptacle 730.

Specifically, by enabling the respective CC1 and CC2 terminals IC controller 704 to be directly connected (e.g., without the utilization of any active electronic component, which further constitutes a reduction of hardware) to the IC controller 704 to the respective CC1 and CC2 terminals of the Type-C receptacle 730 and including the overcurrent detection and protection circuitry are constructed as part of the IC controller 704 (e.g., on-chip), the present techniques may reduce, for example, response time, BOM, and power consumption of the system 700. This may also prevent or reduce damaged caused to the IC controller 704 and to other device or components that may be couple to the IC controller.

Unless specifically stated otherwise, terms such as "receiving," "providing," "detecting," "determining," "adjusting," "activating," "deactivating," "refraining," "comparing," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "may include", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component.

Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An electronic device, comprising:
    a power switch configured to:
        receive a voltage on a first terminal, wherein the first terminal is coupled to a voltage regulator;
        provide the voltage to a second terminal, wherein the second terminal is coupled to a $V_{BUS}$ terminal of a Universal Serial Bus Type-C (USB-C) connector; and
    a protection circuit comprising a comparison component coupled to the first terminal and the second terminal, wherein:
        the comparison component is configured to:
            detect a first voltage at the first terminal; and
            detect a second voltage at the second terminal; and
        the protection circuit is configured to:
            determine whether the second voltage is within a threshold voltage of the first voltage; and
            adjust operation of the power switch in response to determining that the second voltage is within the threshold voltage of the first voltage.

2. The electronic device of claim 1, wherein to adjust the operation of the power switch the protection circuit is configured to:
    deactivate the power switch.

3. The electronic device of claim 1, wherein to determine whether the second voltage is within the threshold voltage of the first voltage the protection circuit is configured to:
    determine whether the second voltage is within a range of threshold voltages.

4. The electronic device of claim 3, wherein to adjust the operation of the power switch the protection circuit is configured to:
    adjust a duty cycle of the power switch based on the range of threshold voltages.

5. The electronic device of claim 3, wherein to adjust the operation of the power switch the protection circuit is configured to:
    partially activate the power switch based on the range of threshold voltages.

6. The electronic device of claim 1, wherein:
    the protection circuit further comprises a duty cycle component coupled to the comparison component; and
    the duty cycle component is configured to adjust a duty cycle of the power switch.

7. The electronic device of claim 1, wherein:
    the protection circuit further comprises a current source coupled to a first gate of the power switch; and
    the current source is configured to partially activate the power switch.

8. The electronic device of claim 1, wherein the comparison component comprises a programmable comparison component.

9. The electronic device of claim 1, wherein the protection circuit is further configured to:
    refrain from adjusting the operation of the power switch in response to determining that the second voltage is within the threshold voltage of the first voltage.

10. The electronic device of claim 1, wherein the protection circuit is configured to detect a reverse current condition.

11. The electronic device of claim 1, further comprising:
    a current control circuit coupled to the first terminal, wherein the current control circuit is configured to:
        determine whether a current flowing through the power switch is greater than a threshold current; and
        reduce the current flowing through the power switch in response to determining that the current flowing through the power switch is within the threshold current.

12. The electronic device of claim 11, wherein:
    the current control circuit further comprise a current source coupled to a first gate of the power switch; and
    the current source is configured to partially activate the power switch.

13. The electronic device of claim 11, wherein the current control circuit comprises a current sense amplifier coupled to the first terminal and a reference current source.

14. The electronic device of claim 13, wherein:
    the current sense amplifier comprises a programmable amplifier; and the reference current source comprises a programmable current source.

15. A system, comprising:
a Universal Serial Bus Type-C (USB-C) connector; and
a power switch configured to:
   receive a voltage on a first terminal, wherein the first terminal is coupled to a voltage regulator;
   provide the voltage to a second terminal, wherein the second terminal is coupled to a $V_{BUS}$ terminal of the Universal Serial Bus Type-C (USB-C) connector; and
a protection circuit comprising a comparison component coupled to the first terminal and the second terminal, wherein:
   the comparison component is configured to:
      detect a first voltage at the first terminal; and
      detect a second voltage at the second terminal; and
   the protection circuit is configured to:
      determine whether the second voltage is within a threshold voltage of the first voltage; and
adjust operation of the power switch in response to determining that the second voltage is within the threshold voltage of the first voltage.

16. The system of claim 15, further comprising:
a current control circuit coupled to the first terminal, wherein the current control circuit is configured to:
   determine whether a current flowing through the power switch is greater than a threshold current; and
   reduce the current flowing through the power switch in response to determining that the current flowing through the power switch is within the threshold current.

17. A method, comprising:
receiving, by a power switch, a voltage on a first terminal, wherein the first terminal is coupled to a voltage regulator;
providing, by the power switch, the voltage to a second terminal, wherein the second terminal is coupled to a $V_{BUS}$ terminal of a Universal Serial Bus Type-C (USB-C) connector;
detecting a first voltage at the first terminal;
detecting a second voltage at the second terminal;
determining whether the second voltage is within a threshold voltage of the first voltage; and
adjusting operation of the power switch in response to determining that the second voltage is within the threshold voltage of the first voltage.

18. The method of claim 17, wherein adjusting the operation of the power switch comprises:
deactivating the power switch.

19. The method of claim 17, wherein adjusting the operation of the power switch comprises:
adjusting a duty cycle of the power switch.

20. The method of claim 17, wherein adjusting the operation of the power switch comprises:
partially activating the power switch based.

* * * * *